US011290092B1

(12) United States Patent
Gupta et al.

(10) Patent No.: US 11,290,092 B1
(45) Date of Patent: Mar. 29, 2022

(54) LEVEL SHIFTER CIRCUITS

(71) Applicant: Samsung Electronics Co., Ltd., Suwon-si (KR)

(72) Inventors: Ankur Gupta, Bangalore (IN); Lava Kumar Pulluru, Bangalore (IN); Parvinder Kumar Rana, Bangalore (IN)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/175,818

(22) Filed: Feb. 15, 2021

(30) Foreign Application Priority Data

Sep. 29, 2020 (IN) .............................. 202041042386

(51) Int. Cl.
*G11C 11/40* (2006.01)
*H03K 3/356* (2006.01)
*H03K 19/0185* (2006.01)
*G11C 11/419* (2006.01)
*G11C 11/412* (2006.01)

(52) U.S. Cl.
CPC ...... *H03K 3/356113* (2013.01); *G11C 11/412* (2013.01); *G11C 11/419* (2013.01); *H03K 3/356182* (2013.01); *H03K 19/018521* (2013.01)

(58) Field of Classification Search
CPC combination set(s) only.
See application file for complete search history.

(56) References Cited

U.S. PATENT DOCUMENTS

| 7,710,796 | B2 | 5/2010 | Cottier et al. |
| 8,279,687 | B2 | 10/2012 | Adams et al. |
| 8,432,751 | B2 * | 4/2013 | Hafez .................. H03K 19/173 365/189.16 |
| 8,488,396 | B2 | 7/2013 | Lee et al. |
| 8,724,421 | B2 * | 5/2014 | Evans ....................... G06F 1/10 365/226 |
| 9,570,118 | B2 | 2/2017 | Lee et al. |
| 10,032,507 | B2 | 7/2018 | Ngo et al. |

* cited by examiner

*Primary Examiner* — Long Nguyen
(74) *Attorney, Agent, or Firm* — Harness, Dickey & Pierce, P.L.C.

(57) ABSTRACT

An apparatus includes a NMOS transistor having a drain, a first PMOS transistor having a drain connected to the drain of the NMOS transistor, a level shifter having an input and an output, the input of the level shifter being connected to the drain of the NMOS transistor and the drain of the first PMOS transistor, a first digital logic circuit having a drain and a gate, a first inverter having an input connected to the Aoutput of the level shifter and the drain of the first digital logic circuit, and a second digital logic circuit having an output connected to the gate of the first digital logic circuit, at least one condition being set in the apparatus during a read operation.

20 Claims, 11 Drawing Sheets

LEVEL SHIFTER CIRCUITS

CROSS-REFERENCE TO RELATED APPLICATION(S)

This application claims benefit of priority to Indian Patent Application No. 202041042386 filed on Sep. 29, 2020 in the Indian Intellectual Property Office, the disclosure of which is incorporated herein by reference in its entirety.

TECHNICAL FIELD

The present disclosure relates to level shifter circuits.

BACKGROUND

In general, an on-chip memory (e.g., Static Random Access Memory (SRAM), Digital Radio Frequency (RF) Memory (DRFM), Read Only Memory (ROM), etc.) uses multiple power supplies for power savings in different modes of a System-on-Chip (SOC). When a signal crosses one power domain to another in the SOC, a level shifter circuit is used to ensure robustness of the SOC design. This results in a timing penalty in memory performance.

SUMMARY

Some example embodiments herein disclose an apparatus.

In some example embodiments, the apparatus includes a NMOS transistor having a drain, a first PMOS transistor having a drain connected to the drain of the NMOS transistor, a level shifter having an input and an output, the input of the level shifter being connected to the drain of the NMOS transistor and the drain of the first PMOS transistor, a first digital logic circuit having a drain and a gate, a first inverter having an input connected to the output of the level shifter and the drain of the first digital logic circuit, and a second digital logic circuit having an output connected to the gate of the first digital logic circuit, at least one condition being set in the apparatus during a read operation.

In some example embodiments, the first digital logic circuit is configured to operate on a falling edge of an input associated with the level shifter.

In some example embodiments, a source of the first digital logic circuit is connected to a power supply, and the gate of the first digital logic circuit is configured to receive a switch enable signal driven by the second digital logic circuit based on first read data.

In some example embodiments, wherein the drain of the NMOS transistor and the drain of the first PMOS transistor are connected to each other at a latched node, and the latched node only toggles during a read operation. Further, the apparatus may further include a second inverter having an output connected to a gate of the first PMOS transistor, wherein the gate of the NMOS transistor is configured to receive first read data, and the gate of the first PMOS transistor is configured to receive inverted read data after the inverted read data passes through the second inverter. Further, the gate of the first digital logic circuit is configured to receive first read data after the first read data passes through the second digital logic circuit.

In some example embodiments, the at least one condition during a read 1 condition includes first read data input to a gate of the NMOS transistor has a ground voltage, inverted read data input to the second inverter has the ground voltage, a latched node at the input of the level shifter has the ground voltage, and an output of the first inverter has the ground voltage, and a plurality of subsequent conditions occur in response to the at least one condition during the read 1 condition including the inverted read data rises to a first power supply voltage such that the first PMOS transistor turns on and the latched node rises to the first power supply voltage, and an output of the level shifter falls to the ground voltage from an initial voltage such that the output of the first inverter rises to a second power supply voltage.

In some example embodiments, the at least one condition during a read 0 operation includes first read data input to a gate of the NMOS transistor has a ground voltage, the first read data being a pulse signal only enabled during the read 0 operation, inverted read data input to the second inverter has the ground voltage, a latched node at the input of the level shifter has a first power supply voltage, an output of the first inverter has a second power supply voltage, and a plurality of subsequent conditions occur in response to the at least one condition during the read 0 operation including the first read data rises to the first power supply voltage such that the NMOS transistor turns on, and the latched node falls to the ground voltage, and a voltage at the gate of the first digital logic circuit falls to the ground voltage such that the first digital logic circuit turns on and the output of the level shifter rises to the second power supply voltage, the input of the level shifter falls to the ground voltage from a first initial voltage, and the output of the first inverter falls to the ground voltage from a second initial voltage.

BRIEF DESCRIPTION OF FIGURES

Some example embodiments are illustrated in the accompanying drawings, throughout which like reference letters indicate corresponding parts in the various figures. Some example embodiments herein will be better understood from the following description with reference to the drawings, in which.

DETAILED DESCRIPTION

Figure 1:
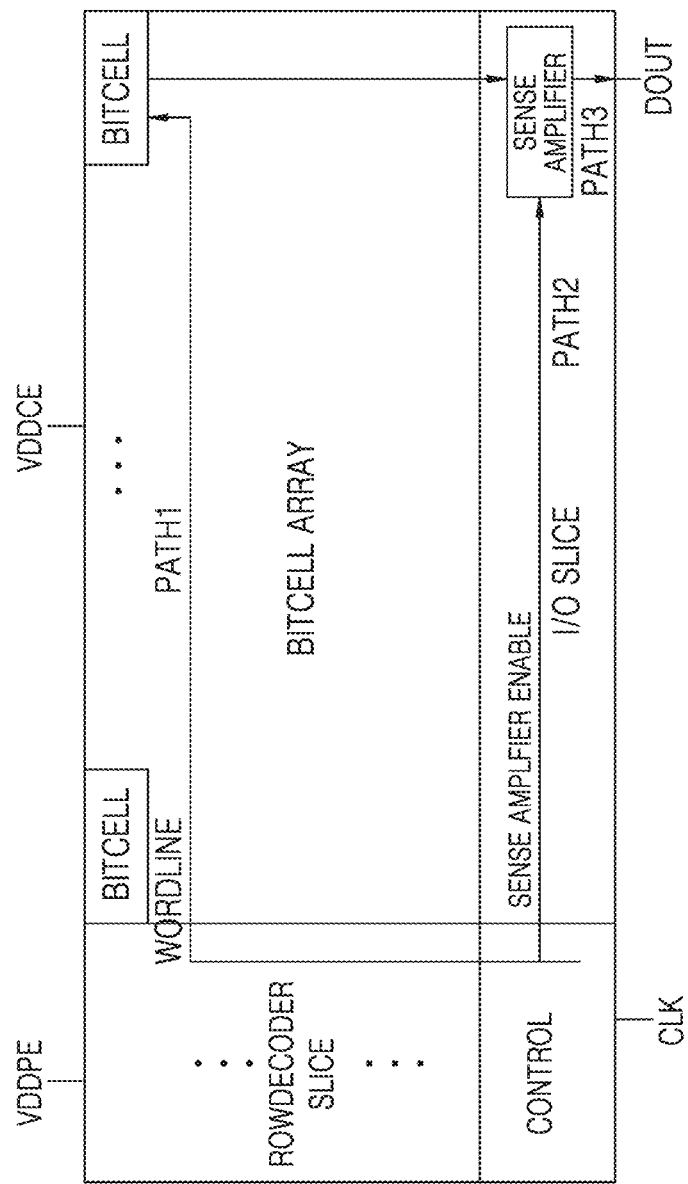
FIG. 1 illustrates a performance of an on-chip memory determined by a cycle time and an access time.

Some example embodiments herein and the various features and advantageous details thereof are explained more fully with reference to the non-limiting examples that are illustrated in the accompanying drawings and detailed in the following description. Descriptions of well-known components and processing techniques are omitted so as to not obscure some example embodiments herein. Also, the some example embodiments described herein are not mutually exclusive, as some example embodiments may be combined. The term "or" as used herein, refers to a non-exclusive or, unless otherwise indicated. The examples used herein are intended merely to facilitate an understanding of ways in which some example embodiments herein may be practiced and to further enable those skilled in the art to practice the same. Accordingly, the examples should not be construed as limiting the scope of some example embodiments herein.

As is traditional in the field, some example embodiments may be described and illustrated in terms of blocks which carry out a described function or functions. According to some example embodiments, these blocks, which may be referred to herein as units or modules or the like, may be physically implemented by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. For example, blocks may be implemented by analog or digital circuits such as logic gates, integrated circuits, microprocessors, microcontrollers, memory circuits, passive electronic components, active electronic components, optical components, hardwired circuits, or the like, and may optionally be driven by firmware and software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block may be physically separated into two or more interacting and discrete blocks without departing from the scope of some example embodiments. Likewise, the blocks may be physically combined into more complex blocks without departing from the scope of some example embodiments.

The accompanying drawings may be used to help easily understand various technical features and it should be understood that some example embodiments presented herein are not limited by the accompanying drawings. As such, the present disclosure should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

FIG. 1 illustrates a performance of the on-chip memory as determined by a cycle time and an access time. The on-chip memory includes a bitcell array having a plurality of bitcells. A wordline of the bitcell array is selected by a row decoder (e.g., row decoder slice) under the control of processing circuitry (e.g., control). A bitline of the bitcell array is selected by the processing circuitry by applying a control signal (e.g., sense amplifier enable) via an I/O slice to one or more sense amplifiers in order to perform an input and/or output (e.g., DOUT) operation. The processing circuitry may operate according to a clock signal. The processing circuitry, row decoder and/or I/O slice may correspond to a first power domain (e.g., a first supply voltage VDDPE). The bitcell array and/or sense amplifier(s) may correspond to a second power domain (e.g., a second supply voltage VDDCE). The cycle time is a minimum time or shortest time used for the memory to perform an access operation. The access time refers to time used for reading data from the memory. Read 0 is defined as reading data 0 from a bit cell (e.g. an SRAM cell). Read 1 is defined as reading data 1 from the bit cell. An access time path may be subdivided into 3 paths:

1. Path 1: Clock to Wordline decoding (~40% of an access time),
2. Path 2: Wordline to a sense ENABLE generation (~40% of access time), and
3. Path 3: Sense ENABLE to output (~20% of the access time).

Figure 2:
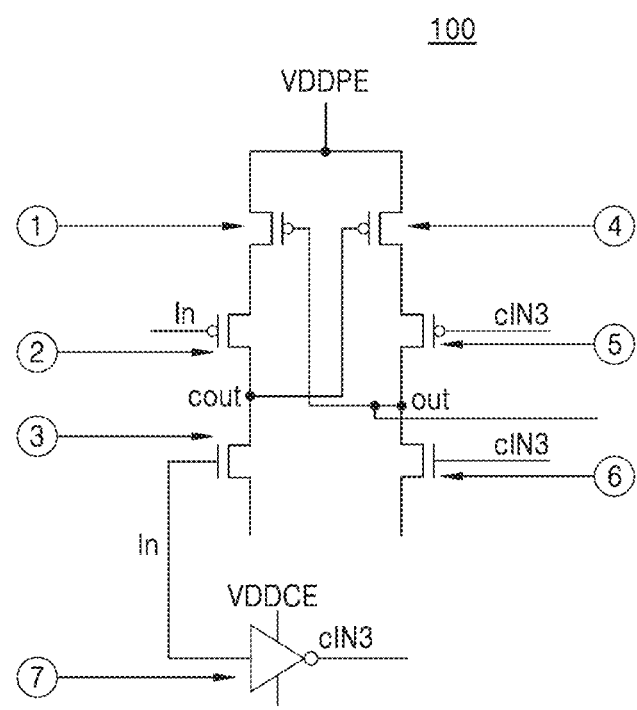
FIG. 2 represent a level shifter circuit.

FIG. 2 represents a level shifter circuit (100). The level shifter circuit (100) includes 4 P-type metal-oxide (PMOS) transistors (also referred to herein as PMOS) (e.g., the PMOS (1), the PMOS (2), the PMOS (4), and the PMOS (5)), 2 N-type metal-oxide (NMOS) transistors (also referred to herein as NMOS) (the NMOS (3) and the NMOS (6)) and/or an inverter (7). A source of the PMOS (1) is connected to a power supply voltage VDDPE, while a drain of the PMOS (1) is connected to a source of the PMOS (2). A drain of the PMOS (2) is connected to a drain of the NMOS (3) at a common node cOUT. A signal IN is connected to the inverter (7), the PMOS (2) gate and the NMOS (3) gate. The inverter is driven by a power supply voltage VDDCE. According to some example embodiments, the power supply voltage VDDCE may be different from the power supply voltage VDDPE. An output of the inverter (7) is a signal cIN3. The signal cIN3 is connected to a gate of the PMOS (5) and a gate of the NMOS (6). A drain of the NMOS (6) is connected to a drain of the PMOS (5) at a common node OUT. A source of the PMOS (4) is connected to the power supply VDDPE and a drain of the PMOS (4) is connected to the drain of the PMOS (5). According to some example embodiments, the signal IN corresponds to a signal input to the level shifter circuit (100) and a value and/or voltage at the common node OUT corresponds to a signal output from the level shifter circuit (100).

Referring to FIG. 2, in an input rising edge operation, initial conditions may include: the input signal IN=0, the signal cIN3=the power supply VDDCE, the common node cOUT=VDDPE and the common node OUT=0. According to some example embodiments, the values discussed in association with signals, nodes, etc. herein may represent voltages corresponding to logic values. In accordance with these initial conditions, the NMOS (3) turns on, the PMOS (2) turns off fully or partially so the common node cOUT falls to 0, the signal cIN3 falls to 0, the NMOS (6) turns off, the PMOS (5) turns on, and/or the PMOS (4) turns on after cOUT falls to 0 such that the common node OUT rises to VDDPE.

In an input falling edge operation, the initial conditions may include: the input signal IN=VDDCE, the signal cIN3=0, the common node cOUT=0 and the common node OUT=VDDPE. In accordance with these initial conditions, the signal cIN3 rises to VDDCE, the NMOS (6) turns on, the PMOS (5) turns off so the common node OUT falls to 0, the NMOS (3) turns off, the PMOS (2) turns on, and/or the PMOS (1) turns on after the common node OUT falls to 0 so the common node cOUT rises to VDDPE.

The level shifter circuit (100) has a 1 gate delay between a time at which an input (e.g., the input signal IN) begins to rise in the input rising edge operation and a time at which the voltage at the common node cOUT falls to zero. The level shifter circuit (100) has a 2 gate delay between a time at which the input (e.g., the input signal IN) begins to rise in the input rising edge operation and a time at which the common node OUT rises to the voltage VDDPE. The level shifter circuit (100) has a 3 gate delay between a time at which an input (e.g., the input signal IN) begins to fall from the voltage VDDCE in the input falling edge operation and a time at which the common node cOUT rises to the voltage VDDPE. The level shifter circuit (100) has a 2 gate delay between a time at which an input (e.g., the input signal IN) begins to fall from the voltage VDDCE in the input falling edge operation and a time at which the voltage at the common node OUT falls to zero. The pull up strength of the common nodes cOUT and//or OUT is weak due to the PMOS stack which limits max load and the common nodes cOUT and/or OUT have different stage delays in the level shifter circuit (100). Due to this feature of the level shifter circuit (100), the overall performance of the SRAM is degraded. According to some example embodiments, a level shifter circuit is provided that optimizes and/or reduces delay and/or improves the slope of an output signal.

In an SRAM, the level shifter circuit (100) may be used for wordline generation and/or at an input/output interface. In the following example, performance limitation due to use of the level shifter circuit (100) at an output interface is explained.

Figure 3A:
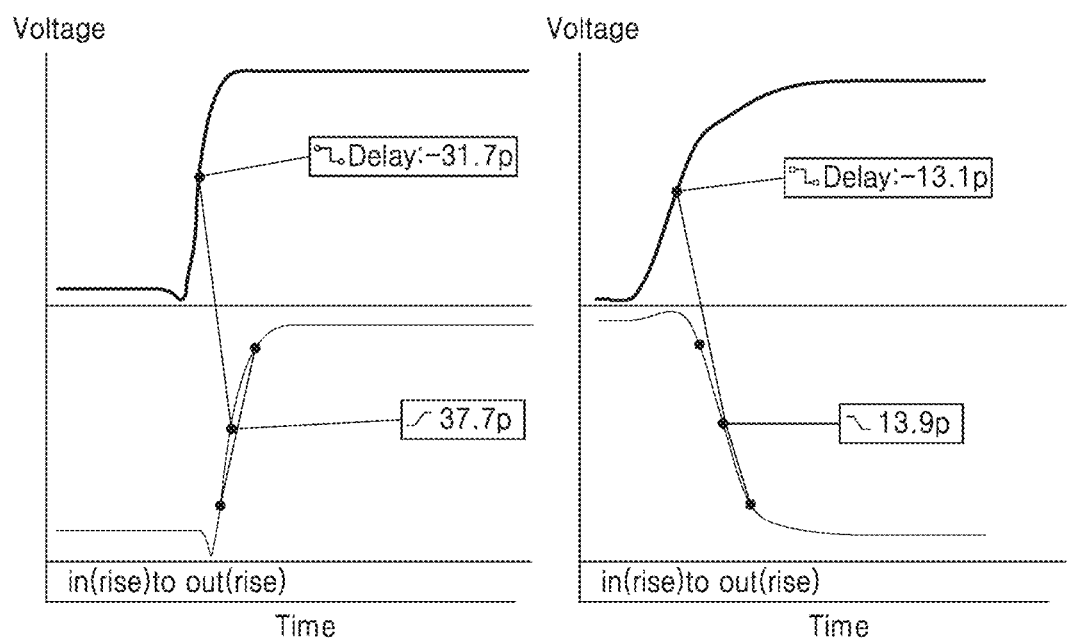
FIG. 3A and FIG. 3B illustrate level shifter circuit waveforms in conjunction with the FIG. 2.
Figure 3B:
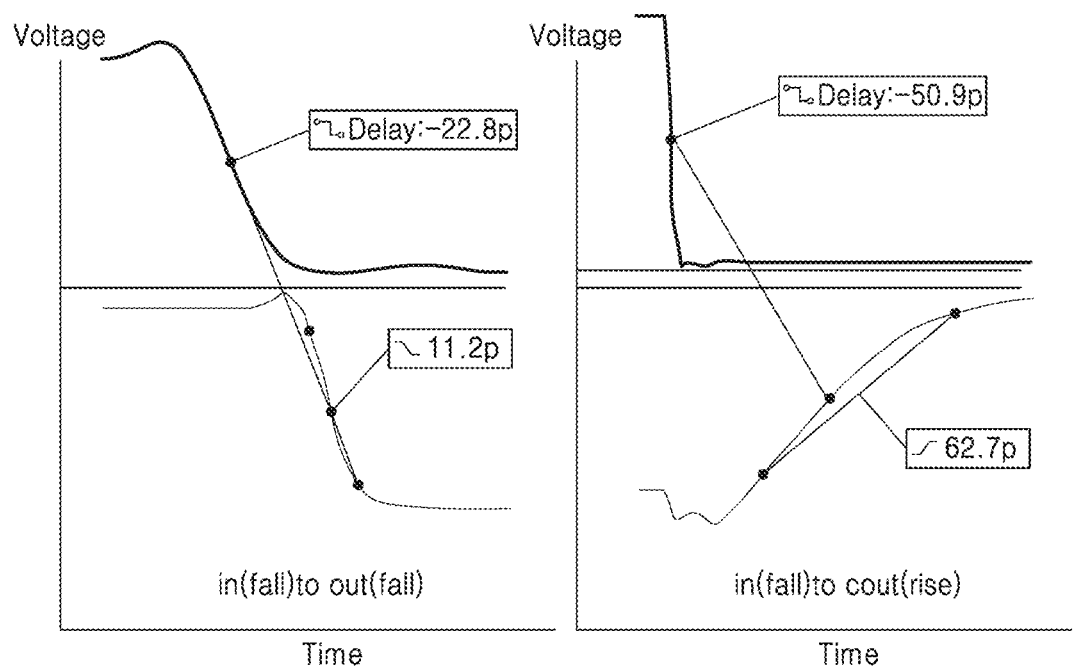

FIG. 3A and FIG. 3B illustrate level shifter circuit waveforms corresponding to the input rising edge and input falling edge operations discussed in association with the FIG. 2. As shown in the left hand side of FIG. 3A, according to the level shifter operation, between a time at which the input (e.g., the input signal IN) begins to rise (upper plot) in the input rising edge operation and a time at which the common node OUT rises (lower plot) to the voltage VDDPE (e.g., in(rise) to out(rise)), there is a two gate delay (32 ps). Also, rise operation is driven by the PMOS stack so the slope of the rising voltage at the common node OUT (37 ps) is greater than a fall transition (11 ps).

As shown in the right hand side of FIG. 3A, according to level shifter operation, between a time at which an input (e.g., the input signal IN) begins to rise (upper plot) in the input rising edge operation and a time at which the voltage at the common node cOUT falls to zero (e.g., in(rise) to cout(fall)), there is a one gate delay (13 ps). Also, the falling voltage of the common node cOUT (lower plot) has a slope (14 ps) that is better than rise transition (63 ps).

As shown in the left hand side of FIG. 3B, according to level shifter operation, between a time at which an input (e.g., the input signal IN) begins to fall from the voltage VDDCE in the input falling edge operation and a time at which the voltage at the common node OUT falls to zero (e.g., in(fall) to out(fall)) (upper plot), there is a two gate delay (23 ps). Also, the falling voltage of the common node OUT (lower plot) has a slope (11 ps) that is better than rise transition (37 ps).

As shown in the right hand side of FIG. 3B, according to level shifter operation, between a time at which an input (e.g., the input signal IN) begins to fall from the voltage VDDCE in the input falling edge operation and a time at which the common node cOUT rises to the voltage VDDPE (e.g., in(fall) to cout(rise)) (upper plot), there is a three gate delay (51 ps). Also, rise operation is driven by PMOS stack so the slope (63 ps) of the rising voltage at the common node cOUT (lower plot) is greater than a fall transition (14 ps).

Figure 4:
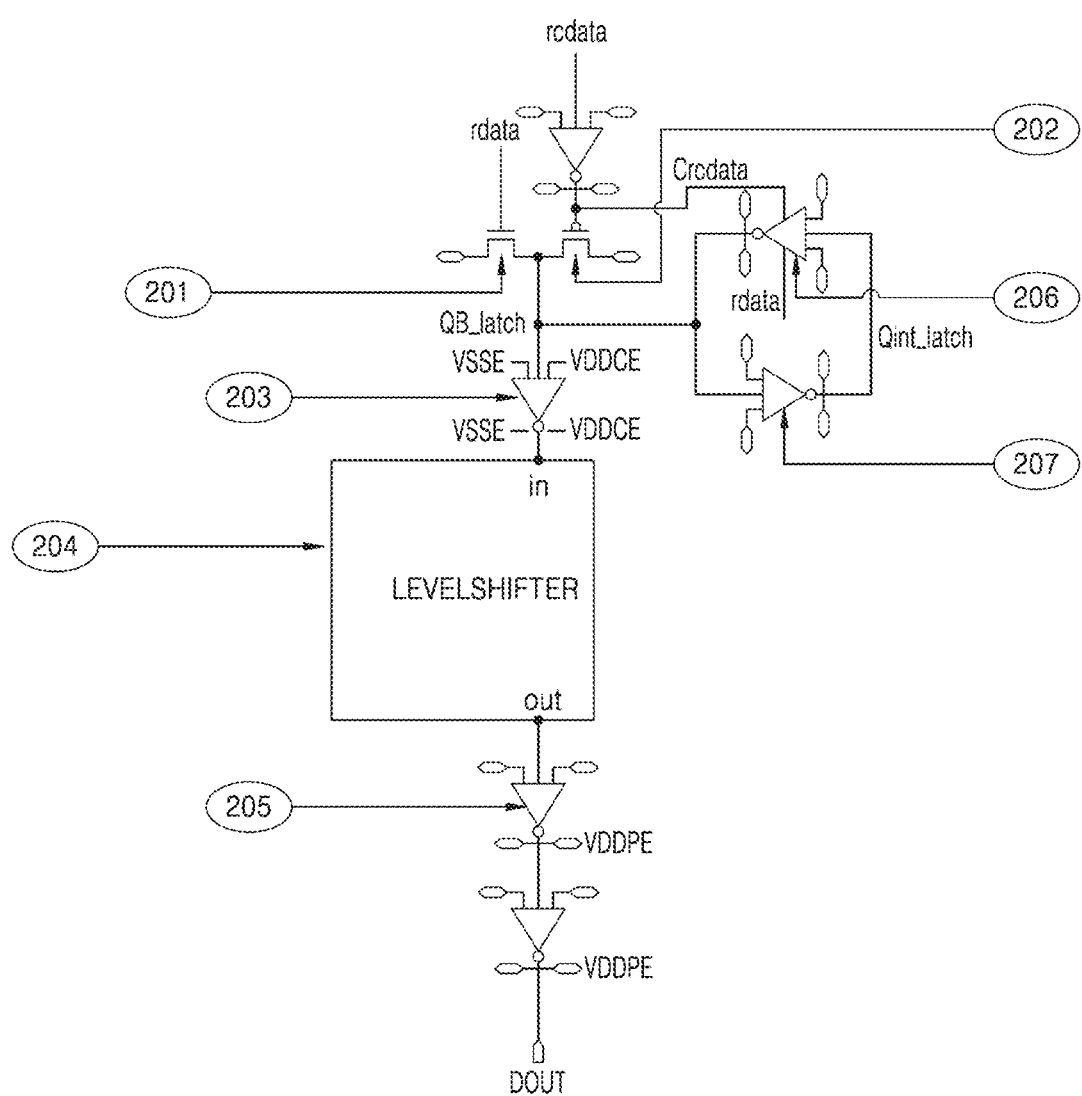
FIG. 4 represents another level shifter circuit for DOUT.

FIG. 4 represents a level shifter circuit (200) for DOUT (e.g., an output node). The level shifter circuit (200) includes a NMOS (201), a PMOS (202), a first inverter (203), a second inverter (205) and/or a level shifter (204). As shown in the FIG. 4, a drain of the NMOS (201) is connected to a drain of the PMOS (202) at a common node "QB_latch". A signal "rdata" is connected to a gate of the NMOS (201), a signal "rcdata" drives another inverter the output of which drives a gate of the PMOS (202). An input of the inverter (203) is connected to the common node "QB_latch" and an output of the inverter (203) is connected to an input "in" of the level shifter (204). An output "out" of the level shifter (204) is connected to an input of the second inverter (205). An output of the second inverter (205) is connected to an output "DOUT" (e.g., via another inverter). The common node QB_latch is a latched node. Specifically, an inverter (207) and a tri-state (206) will store a voltage value of the common node QB_latch in a default state. In the default state, the signals "rdata" and "rcdata" are 0 so a signal Crcdata at the gate of the PMOS (202) has a voltage VDDCE and will keep the tri-state (206) on to latch the data (e.g., the data at the common node QB_latch). According to some example embodiments, the level shifter (204) may be the same as or similar to the level shifter circuit (100) discussed in association with FIG. 2. According to some example embodiments, the level shifter (204) may be implemented using processing circuitry, and may be configured to convert a logic value (e.g., a value of "0" or "1") from a first voltage corresponding to a first circuit (e.g., first power domain) to a second voltage corresponding to a second circuit (e.g., second power domain) different from the first voltage.

In the level shifter circuit (200), the number of stages in a QB_latch to dout path is relatively high. The common node QB_latch is a latched node that toggles only during a read operation. In the read 1 operation, the initial conditions may include: the signal rdata=0, the signal rcdata=0, the common node QB_latch=VDDCE, and the output DOUT=0. In accordance with these initial conditions, the signal rdata rises to VDDCE so that NMOS (201) turns on and the common node QB_latch falls to 0, the input in of the level shifter (204) rises to VDDCE, the output out of the level shifter (204) rises to VDDPE and hence the output DOUT rises to VDDPE.

In the read 0 operation, the initial conditions may include: the signal rdata=0, the signal rcdata=0, the common node QB_latch=0, and the output DOUT=VDDPE. In accordance with these initial conditions, the signal rcdata rises to VDDCE so that the PMOS (202) turns on and the common node QB_latch rises to VDDCE, the input in of the level shifter (204) falls to 0, the output out of the level shifter (204) falls to 0 and hence the output DOUT falls to 0.

The level shifter circuit (200) has a 5 gate delay between a time at which the common node QB_latch rises to the voltage VDDCE and a time at which the output DOUT falls to zero. The level shifter circuit (200) has a 5 gate delay between a time at which the common node QB_latch falls to zero and a time at which the output DOUT rises to the voltage VDDPE. The delay in the rise of the voltage at the output DOUT is due primarily or in part to the PMOS stack.

Figure 5:
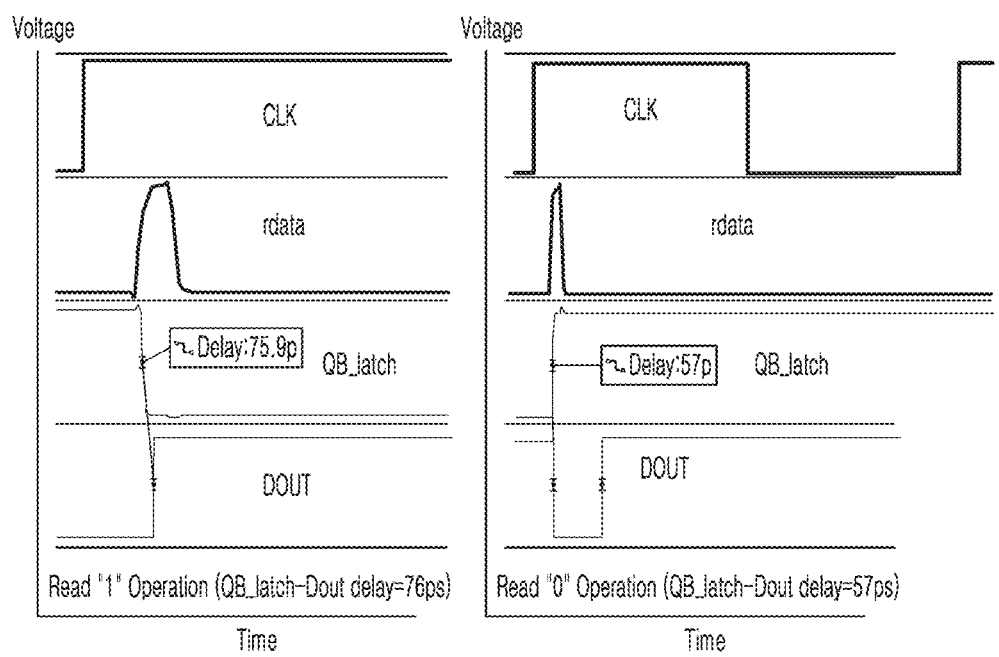
FIG. 5 illustrates level shifter circuit waveforms in conjunction with the FIG. 4.

FIG. 5 illustrates the level shifter circuit (200) waveforms in conjunction with the FIG. 4. The FIG. 5 depicts the level shifter read 0 and read 1 operation waveforms and stage wise delays.

In the read 1 operation: the read "1" will have 5 gate delay from QB_latch to DOUT, total delay is 76 ps. Rise delay is more than fall delay due to the level shifter (204) operation. During read "1" operation, the signal rdata will rise for short duration in comparison to clock period to read the data. In the read "0" Operation, read "0" will have 5 gate delay from QB_latch to DOUT, total delay is 57 ps. During read "0" operation, the signal rcdata will rise for short duration in comparison to clock period to read the data.

Thus, it is desired to address the above mentioned disadvantages or other shortcomings or at least provide a useful alternative.

Some example embodiments provide an apparatus (e.g., a level shifter circuit) (300). The apparatus (300) includes a NMOS (301) comprising a source, a drain and a gate. A PMOS (302) includes a source, a drain and a gate. The drain of the NMOS (301) is connected with the drain of the PMOS (302). The drain of the NMOS (301) and the drain of the PMOS (302) are connected with an input part of the level shifter (304). The level shifter (304) includes the input part and an output part. The output part of the level shifter (304) is connected with a drain of a first digital logic circuit (303) and an input part of an inverter (305). In an example, the digital logic circuit (303) is a PMOS. An output part of a second digital logic circuit (306) is connected with a gate of the digital logic circuit (303). In an example, the digital logic circuit (306) is an inverter. The apparatus (300) is configured such that at least one condition is set in the apparatus (300) during a read condition.

Unlike conventional methods and system, the proposed technique reduces access time by optimizing and/or improving the level shifter circuit.

The proposed apparatus may be implemented in a memory compiler to achieve performance gain. The proposed apparatus has better performance than conventional apparatuses.

Referring now to the drawings, and more particularly to FIGS. 6A through 7B, there are shown some example embodiments.

Figure 6A:
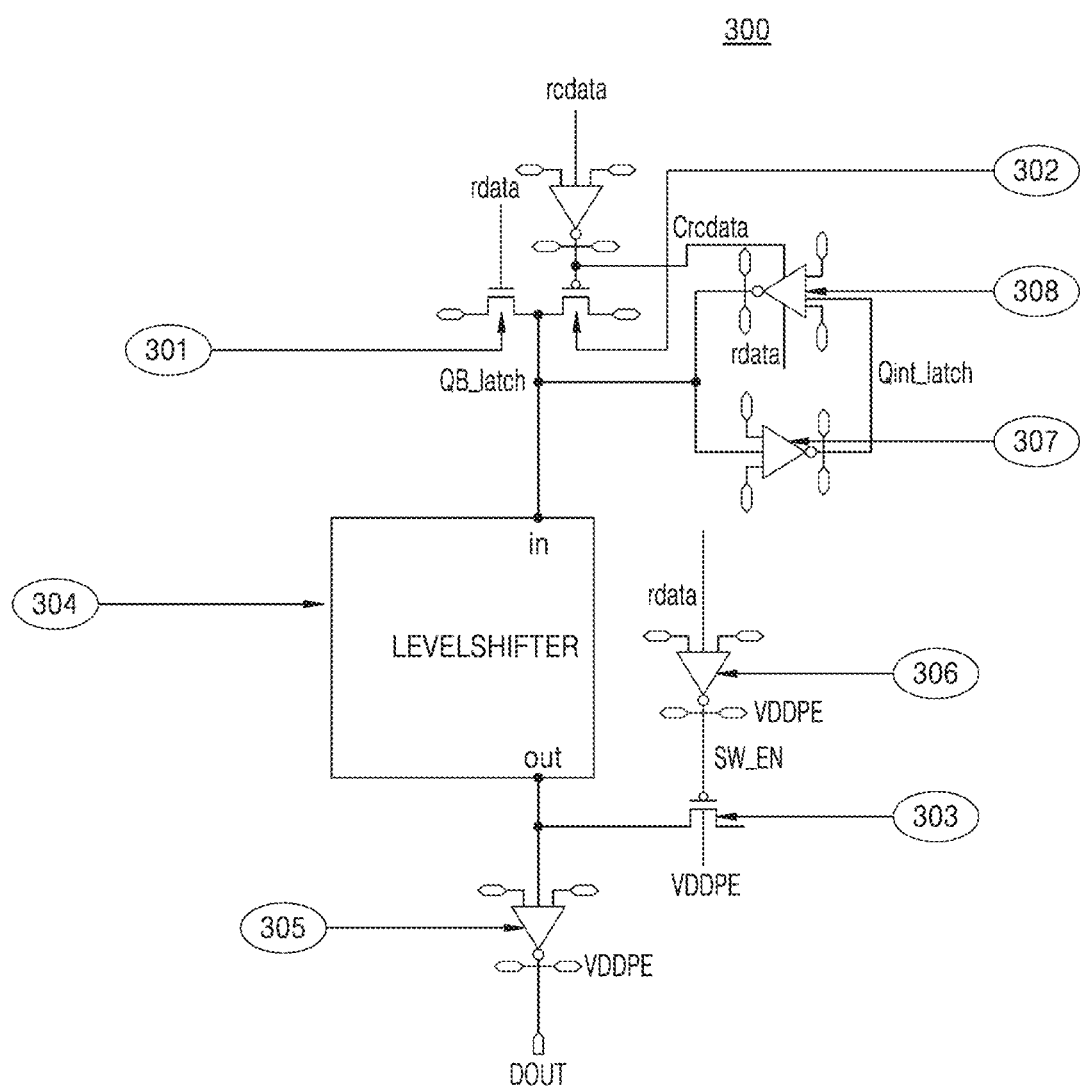
FIGS. 6A and 6B illustrate a circuit diagram of an apparatus, according to some example embodiments as disclosed herein.
Figure 6B:
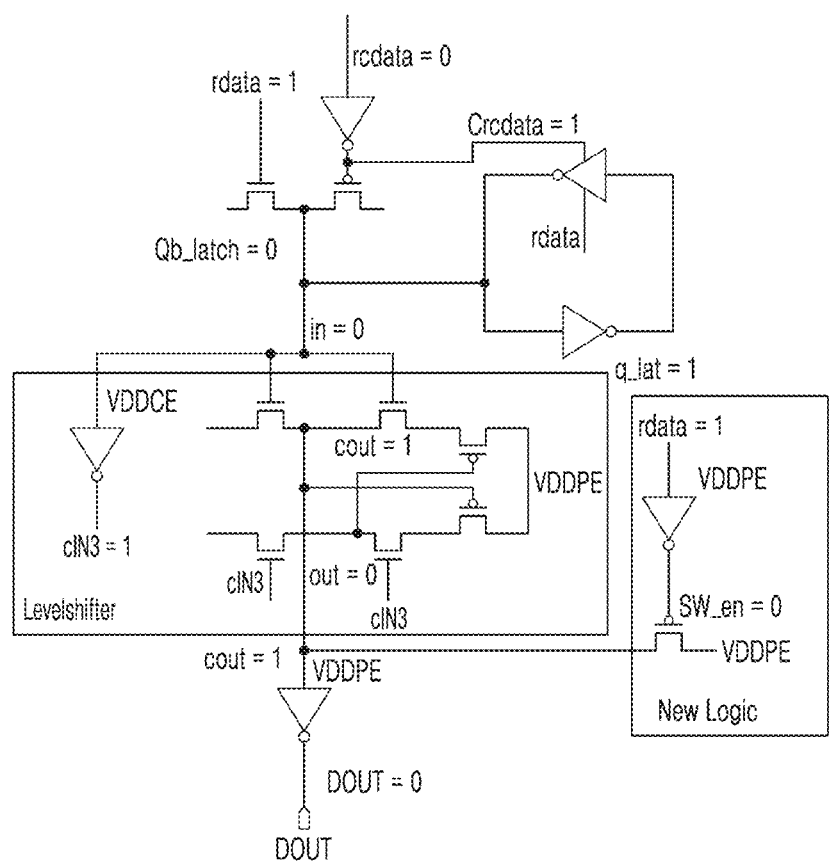

FIGS. 6A and 6B are circuit diagram of an apparatus (300), according to some example embodiments as disclosed herein. As shown in the FIG. 6A, the apparatus (300) includes a NMOS (301) (e.g., a NMOS transistor), a PMOS (302) (e.g., a PMOS transistor), a first circuit (303) (e.g., a first digital logic circuit), a level shifter (304), a first inverter (305), a second circuit (306) (e.g., a second digital logic circuit), a second inverter (307) and/or a tri-state logic (308). The NMOS (301) includes a source, a drain and a gate. The PMOS (302) includes a source, a drain and a gate. The drain of the NMOS (301) is connected with the drain of the PMOS (302). The drain of the NMOS (301) and the drain of the PMOS (302) are connected with an input of the level shifter (304). The level shifter (304) includes the input and an output. The output of the level shifter (304) is connected with a drain of the first digital logic circuit (303) and the input of the first inverter (305). In an example, the first digital logic circuit (303) may be a PMOS transistor or a pull up switch. An output of a second digital logic circuit (306) is connected with a gate of the first digital logic circuit (303). In an example, the second digital logic circuit (306) may be an inverter. The apparatus (300) is configured such that at least one condition is set in the apparatus (300) during a read condition (e.g., a read operation). According to some example embodiments, the level shifter (304) may be the same as or similar to the level shifter circuit (100) discussed in association with FIG. 2. According to some example embodiments, the level shifter (204) may be implemented using processing circuitry, and may be configured to convert a logic value (e.g., a value of "0" or "1") from a first voltage corresponding to a first circuit (e.g., first power domain) to a second voltage corresponding to a second circuit (e.g., second power domain) different from the first voltage.

In some example embodiments, the drain of the NMOS (301) and the drain of the PMOS (302) are connected to each other at a latched node (e.g., QB_latch), wherein the latched node may toggle only during the read operation (e.g., the read 1 operation and/or the read 0 operation) in the apparatus (300). Further, the gate of the NMOS (301) may receive first read data (rdata), and the gate of the PMOS (302) may receive inverted read data (rcdata) after the inverted read data (rcdata) passes through another inverter. Further, the gate of the first digital logic circuit (303) may receive other read data (rdata) through the second digital logic circuit (306). According to some example embodiments, the other read data (rdata) may be the same as or similar to the first read data (rdata). Further, the gate of the PMOS (302) is connected with a tri-state logic (308), wherein the tri-state logic (308) is connected with the second inverter (307). Further, the second inverter (307) and the tri-state logic (308) are connected with the input of the level shifter (304). The tri-state logic (308) may be controlled by an input e.g., the first read rdata and/or a signal Crcdata at the gate of the PMOS (302)).

In some example embodiments, the first digital logic circuit (303) may be operated on a falling edge of an input associated with the level shifter (304).

In some example embodiments, a source of the first digital logic circuit (303) is connected to a power supply (VDDPE), wherein a gate of the first digital logic circuit (303) is connected to with a switch enable signal (SW_EN), wherein the switch enable signal (SW_EN) may be driven by the second digital logic circuit (306) and the other read data (rdata).

In some example embodiments, the apparatus (300) is configured such that at least one condition is set in the apparatus (300) during the read condition comprises the first read data (rdata) is 0 (e.g., a ground voltage), the inverted read data (rcdata) is 0, the latched node (Qb_latch) is 0, and the output (DOUT) is 0. In accordance with these conditions, the inverted read data (rcdata) rises to a voltage VDDCE, so that the PMOS (302) turns on and the latched node (QB_latch) rises to the voltage VDDCE, the input in of the level shifter (304) rises to the voltage VDDCE, the output cout of the level shifter (304) falls to 0, so that the output DOUT rise to the voltage VDDPE during a read 1 condition (e.g., operation).

In some example embodiments, the apparatus (300) is configured such that the at least one condition is set in the apparatus (300) during the read condition (e.g., the read 0 condition) comprises the first read data (rdata) is 0 (e.g., a ground voltage), the inverted read data (rcdata) is 0, the latched node (QB_latch) is the voltage VDDCE, and the output (DOUT) is the voltage VDDPE. In accordance with these conditions, the first read data rdata rises to the voltage VDDCE so that the NMOS (301) turns on and the latched node (QB_latch) falls to 0, the switch enable signal SW_EN falls to 0, so that the first digital logic circuit (303) turns on and the output cout of the level shifter (304) rises to the voltage VDDPE, the input in of the level shifter (304) falls to 0, and the output DOUT falls to 0. The first read data rdata may be a pulse signal which is enabled only during a read 0 operation. The QB_latch may be a latched node. The inverter (307) and the tri-state logic (308) will store the value of the latched node QB_latch in default state. The first read data "rdata" and the inverted read data "rcdata" is 0 in a default state, so the signal Crcdata at the gate of the PMOS (302) is the voltage VDDCE and will keep the tri-state logic (308) on to latch the data (e.g., the data at the common node QB_latch).

As shown in the FIG. 6B, the novel levelshifter topology makes use of already available differential input signals "rdata" and "rcdata" to improve the performance. In proposed levelshifter as shown in the FIG. 6B, a parallel path is added to levelshifter which is enabled only during the fall edge of input. With the updated topology delay from level shifter input to "cout" is 1 gate for both rise and fall edge. The PMOS added in parallel can be higher strength as it does not impact the voltage difference supported by level shifter. It results in 3 gate delay savings in access time.

Figure 7A:
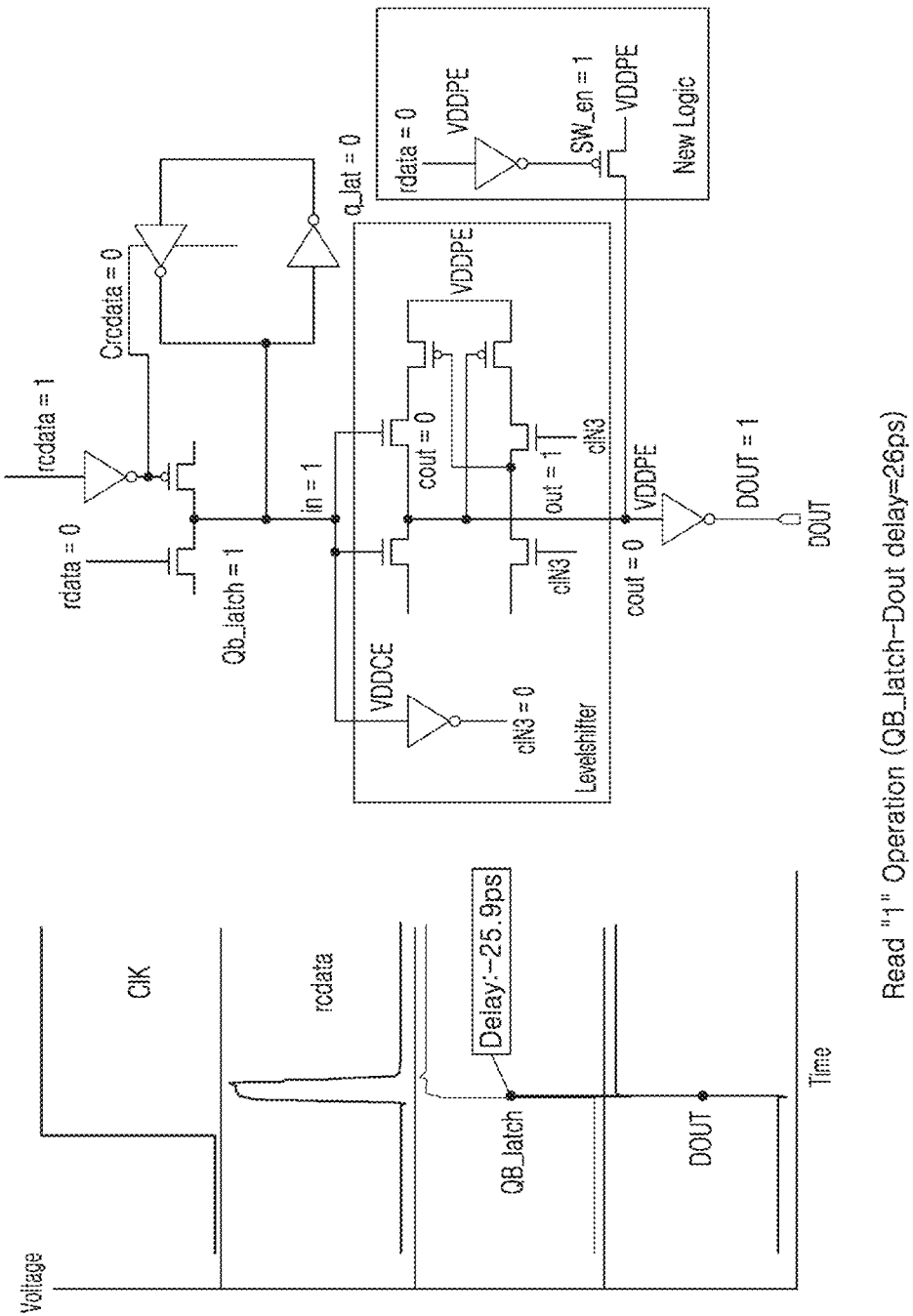
FIGS. 7A and 7B illustrate level shifter circuit waveforms in conjunction with the FIGS. 6a and 6b, according to some example embodiments as disclosed herein.
Figure 7B:
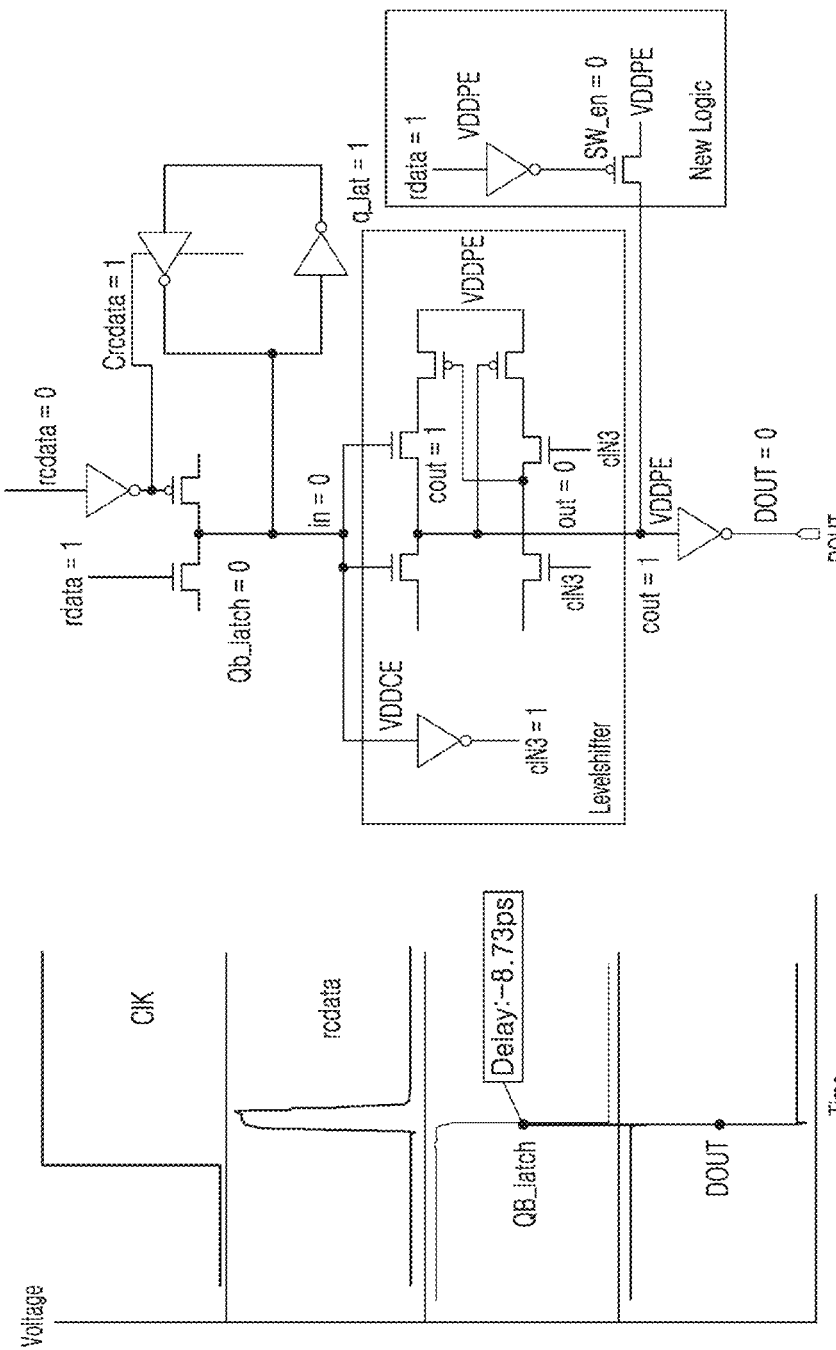

FIGS. 7A and 7B illustrate level shifter circuit (300) waveforms in conjunction with the level shifter circuit (300) of FIGS. 6A and 6B according to some example embodiments as disclosed herein.

As shown in FIG. 7A and FIG. 7B, for the read "1" operation, the read "1" will have a 2 gate delay from QB_latch to DOUT, with a total delay of 26 ps. During the read "1" operation, rcdata will rise for a short duration in comparison to clock period to read the data. For the read "0" operation, the read "0" will have a 2 gate delay from QB_latch to DOUT, with a total delay of 9 ps. During the read "0" operation, rdata will rise for short duration in comparison to clock period to read the data. The pulse behavior of "rdata" may be utilized in this scheme to avoid continuous leakage path in the inverter (306). The data "rdata" signal may be in the VDDCE domain (e.g., a first power domain) while the inverter (306) is the VDDPE domain (e.g., a second power domain).

FIG. 7A represents read 1 in the proposed solution, "rcdata" rises to 1 and charges Qb_latch to 1. As the input of levelshifter toggles from 0 to 1, cout node of the levelshifter toggles from 1 to 0 and the output of the final driver toggles from 0 to 1. Therefore, there is 2 gate delay between Qb_latch rise to DOUT rise (levelshifter and final driver).

FIG. 7B represents read 0 in proposed solution, rdata toggles from 0 to 1. The Qb_latch and sw_en signal both fall to 0, toggling the cout signal to 1 and the DOUT to 0. Here rdata is a pulse signal which is toggled only during read 0 operation. The Pmos strength is more than the levelshifter stack to enable better slope for rise of cout. There is 2 gate delay between Qb_latch fall to DOUT fall (levelshifter and inverter).

Figure 8:
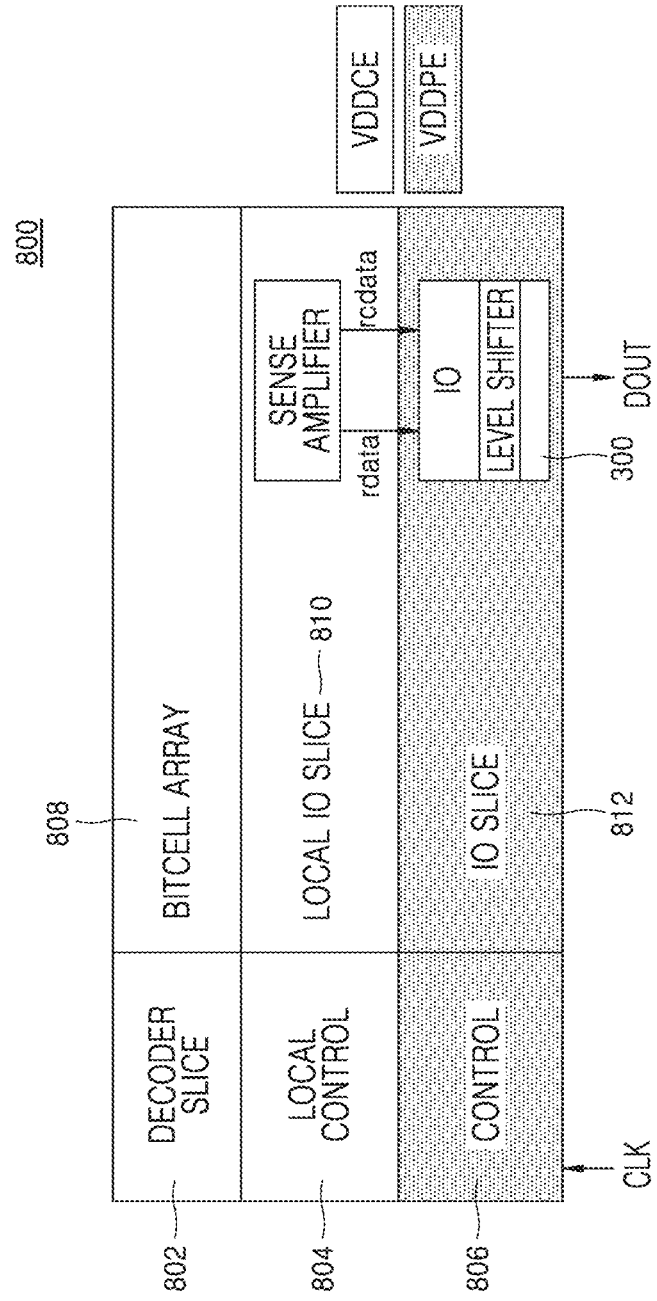
FIG. 8 illustrate a memory device illustrating the apparatus, according to some example embodiments as disclosed herein.

FIG. 8 illustrate a memory device (800) including the apparatus (300), according to some example embodiments as disclosed herein. The operations and functions of the apparatus (300) are already explained in conjunction with the FIGS. 6A, 6B, 7A and 7B. The memory device (800) includes a bitcell array (808) having a plurality of bitcells. A wordline of the bitcell array (808) is selected by a row decoder (e.g., row decoder slice (802) includes multiple row decoders which selects wordline based on address input) under a control of processing circuitry (e.g., control block (806) includes input levelshifter to change input from VDDPE to VDDCE domain, while local control (804) generated different signals based on read and write operation). A bitline of the bitcell array (808) is selected by a processing circuitry by applying a control signal (e.g., sense amplifier enable signal from a sense amplifier (814)) via an local I/O slice (810) to one or more sense amplifiers (814) in order to perform an input and/or output (e.g., DOUT) operation. The processing circuitry may operate according to a clock signal. The processing circuitry, row decoder and/or I/O slice (812) may correspond to a first power domain (e.g., a first supply voltage VDDPE). The bitcell array (808) and the sense amplifier(s) (814) may correspond to a second power domain (e.g., a second supply voltage VDDCE). The cycle time is a minimum time or shortest time used for the memory to perform an access operation. The access time refers to time used for reading data from the memory device (800).

Some example embodiments disclosed herein may be implemented using processing circuitry, for example, at least one software program running on at least one hardware device and performing network management functions to control the elements.

The foregoing description of the some example embodiments will so fully reveal the general nature of the same that others may, by applying current knowledge, readily modify and/or adapt for various applications some example embodiments without departing from the generic concept, and, therefore, such adaptations and modifications should and are intended to be comprehended within the meaning and range of equivalents of the some example embodiments. It is to be understood that the phraseology or terminology employed herein is for the use of description and not of limitation. Therefore, while some example embodiments herein have been described, those skilled in the art will recognize that some example embodiments herein may be practiced with modification within the spirit and scope of thereof as described herein.

We claim:
1. An apparatus comprising:
an NMOS transistor having a drain;
a first PMOS transistor having a drain connected to the drain of the NMOS transistor;
a level shifter having an input and an output, the input of the level shifter being connected to the drain of the NMOS transistor and the drain of the first PMOS transistor;
a first digital logic circuit having a drain and a gate;
a first inverter having an input connected to the output of the level shifter and the drain of the first digital logic circuit; and
a second digital logic circuit having an output connected to the gate of the first digital logic circuit, at least one condition being set in the apparatus during a read operation.
2. The apparatus as claimed in claim 1, further comprising:
a second inverter having an output connected to a gate of the first PMOS transistor,
wherein
the read operation is a read 1 operation,
the at least one condition during the read 1 operation includes
first read data input to a gate of the NMOS transistor has a ground voltage,
inverted read data input to the second inverter has the ground voltage,
a latched node at the input of the level shifter has the ground voltage, and
an output of the first inverter has the ground voltage, and
a plurality of subsequent conditions occur in response to the at least one condition during the read 1 operation including
the inverted read data rises to a first power supply voltage such that the first PMOS transistor turns on and the latched node rises to the first power supply voltage, and
an output of the level shifter falls to the ground voltage from an initial voltage such that the output of the first inverter rises to a second power supply voltage.

3. The apparatus as claimed in claim 1, further comprising:
a second inverter having an output connected to a gate of the first PMOS transistor,
wherein
the read operation is a read 0 operation,
the at least one condition during the read 0 operation includes
first read data input to a gate of the NMOS transistor has a ground voltage, the first read data being a pulse signal only enabled during the read 0 operation,
inverted read data input to the second inverter has the ground voltage,
a latched node at the input of the level shifter has a first power supply voltage, and
an output of the first inverter has a second power supply voltage, and
a plurality of subsequent conditions occur in response to the at least one condition during the read 0 operation including
the first read data rises to the first power supply voltage such that the NMOS transistor turns on, and the latched node falls to the ground voltage, and
a voltage at the gate of the first digital logic circuit falls to the ground voltage such that the first digital logic circuit turns on and the output of the level shifter rises to the second power supply voltage, the input of the level shifter falls to the ground voltage from a first initial voltage, and the output of the first inverter falls to the ground voltage from a second initial voltage.

4. The apparatus as claimed in claim 1, wherein the second digital logic circuit is an inverter.

5. The apparatus as claimed in claim 1, wherein the first digital logic circuit is one of a second PMOS transistor or a pull up switch.

6. The apparatus as claimed in claim 1, wherein the drain of the NMOS transistor and the drain of the first PMOS transistor are connected to each other at a latched node, and the latched node only toggles during a read operation.

7. The apparatus as claimed in claim 1, further comprising:
a second inverter having an output connected to a gate of the first PMOS transistor,
wherein the gate of the NMOS transistor is configured to receive first read data, and the gate of the first PMOS transistor is configured to receive inverted read data after the inverted read data passes through the second inverter.

8. The apparatus as claimed in claim 1, wherein the gate of the first digital logic circuit is configured to receive first read data after the first read data passes through the second digital logic circuit.

9. The apparatus as claimed in claim 1, wherein the first digital logic circuit is configured to operate on a falling edge of an input associated with the level shifter.

10. The apparatus as claimed in claim 1, wherein a source of the first digital logic circuit is connected to a power supply, and the gate of the first digital logic circuit is configured to receive a switch enable signal driven by the second digital logic circuit based on first read data.

11. The apparatus as claimed in claim 1, further comprising:
a tri-state logic connected to the gate of the first PMOS transistor; and
a third inverter connected to the tri-state logic.

12. The apparatus as claimed in claim 11, wherein the third inverter and the tri-state logic are connected to the input of the level shifter.

13. The apparatus as claimed in claim 11, wherein the gate of the first digital logic circuit is configured to receive first read data, the first read data being a pulse signal.

14. The apparatus as claimed in claim 1, wherein the apparatus is implemented in a memory device.

15. An apparatus comprising:
an NMOS transistor having a drain;
a first PMOS transistor having a drain connected to the drain of the NMOS transistor;
a level shifter having an input and an output, the input of the level shifter being connected to the drain of the NMOS transistor and the drain of the first PMOS transistor;
a first inverter having an input connected to the output of the level shifter; and
a parallel path enabled only during a falling edge of the input of the level shifter.

16. The apparatus as claimed in claim 15, wherein the parallel path comprises:
a first digital logic circuit having a drain and a gate; and
a second digital logic circuit having an output connected to the gate of the first digital logic circuit, at least one condition being set in the apparatus during a read operation.

17. The apparatus as claimed in claim 16, wherein a source of the first digital logic circuit is connected to a power supply, and the gate of the first digital logic circuit is configured to receive a switch enable signal driven by the second digital logic circuit based on first read data.

18. The apparatus as claimed in claim 16, wherein the first digital logic circuit is one of a second PMOS transistor or a pull up switch.

19. The apparatus as claimed in claim 16, wherein the gate of the first digital logic circuit is configured to receive first read data after the first read data passes through the second digital logic circuit.

20. A memory device, comprising:
a bit cell array including a plurality of bit cells;
a sense amplifier configured to read data corresponding to a first power domain from the bit cell array; and
a level shifter circuit configured to convert the read data from the first power domain to a second power domain,
wherein, the level shifter circuit includes:
an NMOS transistor having a drain,
a first PMOS transistor having a drain connected to the drain of the NMOS transistor,
a level shifter having an input and an output, the input of the level shifter being connected to the drain of the NMOS transistor and the drain of the first PMOS transistor,
a first digital logic circuit having a drain and a gate,
a first inverter having an input connected to the output of the level shifter and the drain of the first digital logic circuit, and
a second digital logic circuit having an output connected to the gate of the first digital logic circuit, at least one condition being set in the memory device during a read operation.

* * * * *